(12) United States Patent
Lee et al.

(10) Patent No.: US 8,456,900 B2
(45) Date of Patent: Jun. 4, 2013

(54) MEMORY DEVICES AND METHODS OF OPERATING THE SAME

(75) Inventors: Myoung-jae Lee, Hwaseong-si (KR);
Dong-soo Lee, Gunpo-si (KR);
Chang-bum Lee, Seoul (KR);
Seung-ryul Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 197 days.

(21) Appl. No.: 12/926,443

(22) Filed: Nov. 18, 2010

(65) Prior Publication Data
US 2011/0161605 A1 Jun. 30, 2011

(30) Foreign Application Priority Data
Dec. 24, 2009 (KR) .................. 10-2009-0131291

(51) Int. Cl.
*G11C 11/00* (2006.01)
(52) U.S. Cl.
USPC ........................... 365/163; 365/148; 365/158
(58) Field of Classification Search
USPC ........................ 365/163, 148, 158
See application file for complete search history.

(56) References Cited

U.S. PATENT DOCUMENTS

| | | | |
|---|---|---|---|
| 5,926,412 A | 7/1999 | Evans, Jr. et al. | |
| 6,834,008 B2 | 12/2004 | Rinerson et al. | |
| 6,937,528 B2 | 8/2005 | Hush et al. | |
| 6,954,373 B2 * | 10/2005 | Perner | 365/158 |
| 7,035,141 B1 | 4/2006 | Tripsas et al. | |
| 7,251,152 B2 | 7/2007 | Roehr | |
| 7,292,466 B2 * | 11/2007 | Nirschl | 365/148 |
| 7,426,128 B2 | 9/2008 | Scheuerlein | |
| 7,436,695 B2 | 10/2008 | Nirschl et al. | |
| 7,447,062 B2 * | 11/2008 | Burr et al. | 365/163 |
| 7,459,716 B2 | 12/2008 | Toda et al. | |
| 7,557,405 B2 | 7/2009 | Herner et al. | |
| 7,560,339 B2 | 7/2009 | Herner et al. | |
| 7,643,328 B2 | 1/2010 | Tamura et al. | |
| 7,916,516 B2 | 3/2011 | Wei et al. | |
| 7,948,789 B2 | 5/2011 | Muraoka et al. | |

(Continued)

FOREIGN PATENT DOCUMENTS

| | | |
|---|---|---|
| JP | 2008-098537 A | 4/2008 |
| JP | 2008-177469 A | 7/2008 |

(Continued)

OTHER PUBLICATIONS

Extended European Search Report dated Nov. 7, 2011, for Application No. 10196971.5-1233.

(Continued)

*Primary Examiner* — Son Dinh
(74) *Attorney, Agent, or Firm* — Harness, Dickey & Pierce, P.L.C.

(57) ABSTRACT

A memory device includes a memory cell. The memory cell includes: a bipolar memory element and a bidirectional switching element. The bidirectional switching element is connected to ends of the bipolar memory element, and has a bidirectional switching characteristic. The bidirectional switching element includes: a first switching element and a second switching element. The first switching element is connected to a first end of the bipolar memory element and has a first switching direction. The second switching element is connected to a second end of the bipolar memory element and has a second switching direction. The second switching direction is opposite to the first switching direction.

30 Claims, 9 Drawing Sheets

U.S. PATENT DOCUMENTS

| | | |
|---|---|---|
| 7,990,754 B2 | 8/2011 | Azuma et al. |
| 2004/0160818 A1 | 8/2004 | Rinerson et al. |
| 2006/0189077 A1 | 8/2006 | Herner et al. |
| 2007/0205456 A1 | 9/2007 | Lee et al. |
| 2007/0285965 A1 | 12/2007 | Toda et al. |
| 2008/0026510 A1 | 1/2008 | Herner et al. |
| 2008/0123392 A1 | 5/2008 | Kinoshita |
| 2008/0185573 A1 | 8/2008 | Sun et al. |
| 2009/0032795 A1 | 2/2009 | Kim et al. |

FOREIGN PATENT DOCUMENTS

| | | |
|---|---|---|
| KR | 2004-0104967 A | 12/2004 |
| KR | 10-2008-0027932 | 3/2008 |
| KR | 2008-0022085 A | 3/2008 |
| KR | 10-2008-0046123 | 5/2008 |
| KR | 10-2008-0052640 | 6/2008 |
| KR | 2009-0006839 A | 1/2009 |
| KR | 2009-0018504 A | 2/2009 |
| KR | 2010-0024800 A | 3/2010 |

OTHER PUBLICATIONS

Shima Hisashi et al., "Switchable rectifier built with $Pt/TiO_x/Pt$ trilayer", Applied Physics Letters, AIP, American Institute of Physics, Melville, NY, US, vol. 94, No. 8, Feb. 26, 2009.

Ho Do Young et al., "Hysteretic bipolar resistive switching characteristics in $TiO_2/TiO_{2-x}$ multilayer homojunctions", Applied Physics Letters, AIP, American Institute of Physics, Melville, NY, US, vol. 95, No. 9, Sep. 4, 2009.

Notice of Allowance dated Jan. 20, 2012, issued in co-pending U.S. Appl. No. 12/801,533.

Search Report dated Apr. 11, 2011 from the European Patent Office for Application No. 10196971.5.

J. Joshua Yang, et al., "Memristive switching mechanism for metal/oxide/metal nanodevices", Nature Nanotechnology vol. 3, www.nature.com/naturenanotechnology, published online Jun. 15, 2008, pp. 429-433.

* cited by examiner

MEMORY DEVICES AND METHODS OF OPERATING THE SAME

CROSS-REFERENCE TO RELATED APPLICATIONS

This application claims priority under 35 U.S.C. §119 to Korean Patent Application No. 10-2009-0131291, filed on Dec. 24, 2009, in the Korean Intellectual Property Office, the disclosure of which is incorporated herein in its entirety by reference.

BACKGROUND

1. Field

Example embodiments relate to memory devices and methods of operating the same.

2. Description of the Related Art

A resistance memory device is an example of a non-volatile memory device. The resistive memory device stores data using a variable resistance characteristic of a material such as a transition metal oxide. A transition metal oxide has a resistance that significantly changes at a particular voltage level. In other words, the resistance of the variable resistance material decreases when a voltage exceeding a set voltage is applied thereto. This state is referred to as an ON state. Furthermore, when a voltage exceeding a reset voltage is applied to the variable resistance material, the resistance thereof increases. This state is referred to as an OFF state.

SUMMARY

Example embodiments provide memory devices having bipolar characteristics and methods of operating the same. At least some example embodiments provide memory devices having bipolar characteristics and methods of operating the same.

Additional aspects will be set forth in part in the description which follows, and in part, will be apparent from the description, or may be learned by practice of example embodiments.

At least one example embodiment provides a memory device including a memory cell. The memory cell includes: a bipolar memory element; and a bidirectional switching element. The bidirectional switching element is connected to ends of the bipolar memory element, and has a bidirectional switching characteristic.

At least one other example embodiment provides a memory device including a memory cell. According to at least this example embodiment, the memory cell includes: a bipolar memory element; a first switching element connected to an end of the bipolar memory element and having a first switching direction; and a second switching element connected to another end of the bipolar memory element and having a second switching direction. The second switching direction is opposite to the first switching direction.

At least one example embodiment provides a memory card. The memory card includes: a controller and a memory. The memory is configured to exchange data with the controller according to commands from the controller. In one example, the memory includes a memory device, which further includes a memory cell having a bipolar memory element and a bidirectional switching element. The bidirectional switching element is connected to ends of the bipolar memory element, and has a bidirectional switching characteristic.

At least one other example embodiment provides an electronic device. The electronic device includes: a processor configured to execute a program and control the electronic device; an input/output device configured to input/output data to/from the electronic device; and a memory configured to store at least one of codes and programs for operating the processor. The processor, the input/output device and the memory are configured to exchange data via a bus. In one example, the memory includes a memory device, which further includes a memory cell having a bipolar memory element and a bidirectional switching element. The bidirectional switching element is connected to ends of the bipolar memory element, and has a bidirectional switching characteristic.

According to at least some example embodiments, the first and second switching elements may be Schottky diodes. The first switching element may include a first semiconductor layer. The second switching element may include a second semiconductor layer. The first and second semiconductor layers may contact (e.g., directly contact) the bipolar memory element. The bipolar memory element and the first and second semiconductor layers may be oxide layers. An oxygen concentration of the bipolar memory element may be lower than oxygen concentrations of the first and second semiconductor layers.

According to at least some other example embodiments, the first and second switching elements may be pn diodes. In these examples, the first switching element may include a first semiconductor layer, and the second switching element may include a second semiconductor layer. The first and second semiconductor layers may contact the bipolar memory element. A conductive region may be formed in a portion of each of the first and second semiconductor layers contacting the bipolar memory element.

The first and second semiconductor layers may be n-type oxide layers, and the conductive region may have a lower oxygen concentration than the residue regions of the first and second semiconductor layers. Alternatively, the first and second semiconductor layers may be p-type oxide layers, and the conductive region may have a higher oxygen concentration than the residue regions of the first and second semiconductor layers.

The bipolar memory element may be (or constitute) a portion of the first and second switching elements.

According to at least some example embodiments, the memory cell may include a first semiconductor layer having a first conduction type, and second and third semiconductor layers having a second conduction type disposed on both ends of the first semiconductor layer. The first semiconductor layer may be the bipolar memory element, the first semiconductor layer and the second semiconductor layer may form the first switching element; and the first semiconductor layer and the third semiconductor layer may form the second switching element.

According to at least some example embodiments, the bipolar memory element may include an oxide resistor. The oxide resistor may include at least one material selected from the group consisting of or including: Ti oxide, Ni oxide, Cu oxide, Co oxide, Hf oxide, Zr oxide, Zn oxide, W oxide, Nb oxide, TiNi oxide, LiNi oxide, Al oxide, InZn oxide, V oxide, SrZr oxide, SrTi oxide, Cr oxide, Fe oxide, Ta oxide, and PCMO (PrCaMnO).

Each of the first and second switching elements may include an oxide semiconductor. The oxide semiconductor may include an oxide of the same or a different group as the oxide resistor.

The oxygen concentration of at least a portion of the bipolar memory element may be different from the oxygen concentration of at least a portion of the first and second switching elements.

A doping condition of at least a portion of the bipolar memory element may be different from a doping condition of at least a portion of the first and second switching elements.

The bi-directional switching element may directly contact the ends of the bipolar memory element. In one example, the first and second switching elements may directly contact ends of the bipolar memory element.

The memory cell may be an oxide unit.

According to at least some example embodiments, the memory device may further include: a plurality of first electrodes having a wire shape, which are disposed in parallel with each other; and a plurality of second electrodes having a wire shape, which are disposed in parallel with each other. The memory cell may be disposed at each of the intersections of the first and second electrodes.

The memory cell may be a first memory cell, and the memory device may further include a plurality of third electrodes, which cross the second electrodes; and a second memory cell disposed at each of the intersections of the second and third electrodes. The plurality of third electrodes may have a wire shape, and be in parallel with each other.

The second memory cell and the first memory cell may have a same or substantially the same structure.

Alternatively, the second memory cell may have a modified structure from the first memory cell in which the switching directions of first and second switching elements are inversed.

According to at least some example embodiments, an intermediate electrode is not disposed between a memory layer and a switching element to electrically connect the memory layer to the switching element.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
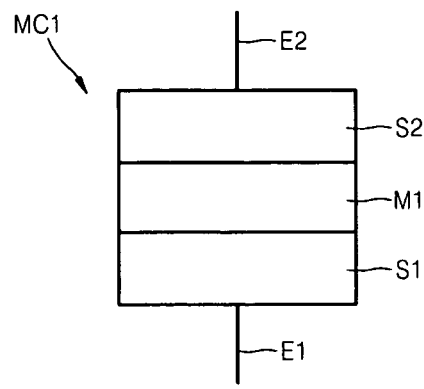
FIG. 1 is a cross-sectional view of a memory cell according to an example embodiment.

Various example embodiments will now be described more fully with reference to the accompanying drawings in which some example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first," "second," etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to schematic cross-sectional illustrations of example embodiments. Variations from the shapes of the illustrations as a result, for example, of manufacturing techniques and/or tolerances, are to be expected. Thus, example embodiments should not be construed as limited to the particular shapes of regions illustrated herein, but are to include deviations in shapes that result, for example, from manufacturing. For example, an implanted region illustrated as a rectangle will, typically, have rounded or curved features and/or a gradient of implant concentration at its edges rather than a binary change from the implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the drawings, the thicknesses of layers and regions are exaggerated for clarity. Like reference numerals in the drawings denote like elements.

Hereinafter, memory devices according to example embodiments and methods of operating the same will be described in more detail with reference to the attached drawings. Throughout the detailed description section of the present application, like reference numerals denote like elements.

FIG. 1 is a cross-sectional view of a memory cell MC1 of a memory device according to an example embodiment.

Referring to FIG. 1, the memory cell MC1 includes a bipolar memory element M1 and first and second switching elements S1 and S2. The first and second switching elements S1 and S2 contact opposite ends of the bipolar memory element M1. More specifically, in the example embodiment shown in FIG. 1, the first and second switching elements S1 and S2 contact top and bottom surfaces, respectively, of the bipolar memory element M1.

In FIG. 1, each of the first and second switching elements S1 and S2 are one-way switching elements, and the switching directions of the first and second switching elements S1 and S2 are opposite to each other. Accordingly, a combination of the first switching element S1 and the second switching element S2 is referred to as a "two-way switching element" or a "bidirectional switching element."

Still referring to FIG. 1, a first electrode E1 is connected to the first switching element S1, and a second electrode E2 is connected to the second switching element S2. In this example, the first electrode E1 contacts a bottom surface of the first switching element S1, whereas the second electrode E2 contacts a top surface of the second switching element S2. The first electrode E1 may be a portion of the first switching element S1, and the second electrode E2 may be a portion of the second switching element S2.

The bipolar memory element M1 may be a resistive memory element. In this regard, the bipolar memory element M1 may include an oxide resistor. The oxide resistor may be a metal oxide resistor, and may also be a variable resistor having a resistance that changes according to an applied voltage. For example, the bipolar memory element M1 may include at least one material selected from the group consisting of or including: titanium (Ti) oxide, nickel (Ni) oxide, copper (Cu) oxide, cobalt (Co) oxide, hafnium (Hf) oxide, zirconium (Zr) oxide, zinc (Zn) oxide, tungsten (W) oxide, niobium (Nb) oxide, titanium nickel (TiNi) oxide, lithium nickel (LiNi) oxide, aluminum (Al) oxide, indium zinc (InZn) oxide, vanadium (V) oxide, strontium zirconium (SrZr) oxide, strontium titanium (SrTi) oxide, chromium (Cr) oxide, iron (Fe) oxide, tantalum (Ta) oxide, a combination thereof or the like. These materials may have a unipolar or bipolar characteristic according to formation conditions. The example embodiment shown in FIG. 1, however, is described with regard to materials having a bipolar characteristic are used.

The material of the bipolar memory element M1 is not limited to the above listed materials. Rather, the bipolar memory element M1 may include other materials such as PrCaMnO (PCMO) or the like having a bipolar characteristic.

Still referring to FIG. 1, each of the first and second switching elements S1 and S2 may be, for example, a diode or a threshold switching device. The diode may be, for example, a Schottky diode or a pn diode. Each of the first and second switching elements S1 and S2 may include an oxide semiconductor. In more detail, when each of the first and second switching elements S1 and S2 is a Schottky diode, each of the first and second switching elements S1 and S2 may include a semiconductor layer and a metal layer, which contact each other. The semiconductor layer may be an oxide layer and may contact the bipolar memory element M1. In one example, the semiconductor layer may be interposed between the metal layer and the bipolar memory element M1. In this example, the metal layer together with the semiconductor layer forms a Schottky barrier. The metal layer may be used as corresponding first or second electrode E1 or E2.

When the first and second switching elements S1 and S2 are pn diodes, each of the first and second switching elements S1 and S2 may include an n-type oxide semiconductor layer and a p-type oxide semiconductor layer, which contact each other. Either of the n-type oxide semiconductor layer and the p-type oxide semiconductor layer may contact the bipolar memory element M1.

The oxide semiconductors of the first and second switching elements S1 and S2 may include an oxide of the same group as the oxide resistor of the bipolar memory element M1. In this case, an oxygen concentration of at least a portion of the oxide semiconductors of the first and second switching elements S1 and S2 is different from an oxygen concentration of at least a portion of the oxide resistor of the bipolar memory element M1. For example, the oxygen concentration of the oxide resistor of the bipolar memory element M1 may be lower than the oxygen concentration of the oxide semiconductors of the first and second switching elements S1 and S2. Alternatively, a doping condition (e.g., doping material and/or doping concentration) of at least a portion of the oxide semiconductors of the first and second switching elements S1 and S2 may be different from a doping condition (e.g., doping material and/or doping concentration) of at least a portion of the oxide resistor of the bipolar memory element M1.

According to at least some other example embodiments, the oxide semiconductors of the first and second switching elements S1 and S2 may include an oxide of a different group from the oxide resistor of the bipolar memory element M1.

Still referring to FIG. 1, the first and second electrodes E1 and E2 may be formed of conventional electrode materials used in semiconductor devices, and each of the first and second electrodes E1 and E2 may have a single-layered or multi-layered structure. For example, each of the first and second electrodes E1 and E2 may include at least one selected from the group including: platinum (Pt), gold (Au), palladium (Pd), iridium (Ir), silver (Ag), nickel (Ni), aluminum (Al), molybdenum (Mo), copper (Cu), combinations thereof or the like. The first and second electrodes E1 and E2 may include the same, substantially the same or different material and/or may have the same, substantially the same or a different structure. According to example embodiments, the first and second electrodes E1 and E2 may or may not be portions of the first and second switching elements S1 and S2, respectively.

Figure 2A:
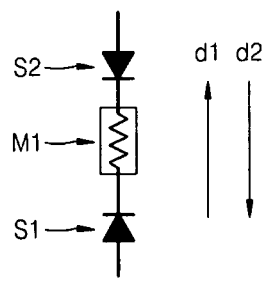
FIGS. 2A and 2B are circuit diagrams corresponding to the memory cell of FIG. 1.
Figure 2B:
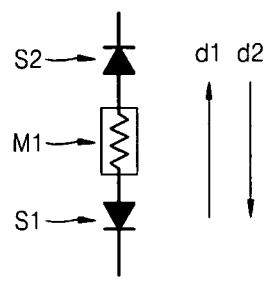

FIGS. 2A and 2B are circuit diagrams of example embodiments of the memory cell MC1 shown in FIG. 1. In the memory cell MC1 of FIGS. 2A and 2B, the first and second switching elements S1 and S2 are diodes.

Referring to FIG. 2A, a switching direction (also referred to as a rectification direction) of the first switching element S1 is a first direction d1, whereas a switching direction of a second switching element S2 is a second direction d2. The second direction d2 is opposite to the first direction d1.

Referring to FIG. 2B, the switching direction of the first switching element S1 is the second direction d2, whereas the switching direction of the second switching element S2 is the first direction d1. Again, the first and second directions d1 and d2 are opposite.

Figure 3:
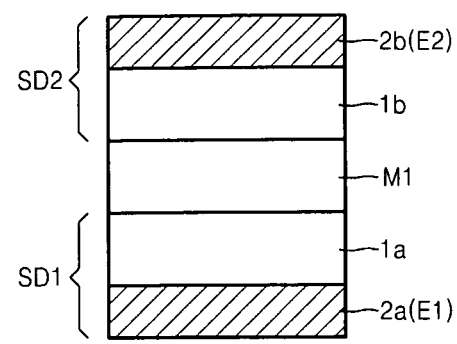
FIG. 3 is a cross-sectional view of an example embodiment of the memory cell of FIG. 1 in which the switching elements are Schottky diodes.

FIG. 3 illustrates an example embodiment of a memory cell in which the first and second switching elements S1 and S2 of FIG. 1 are Schottky diodes.

Referring to FIG. 3, a first Schottky diode SD1 is formed on a bottom surface of the bipolar memory element M1 and a second Schottky diode SD2 is formed on a top surface of the bipolar memory element M1. The first Schottky diode SD1 includes a first semiconductor layer 1a and a first metal layer 2a sequentially disposed on the bottom surface of the bipolar memory element M1. The second Schottky diode SD2 includes a second semiconductor layer 1b and a second metal layer 2b sequentially disposed on the top surface of the bipolar memory element M1. Each of the first and second semiconductor layers 1a and 1b may be an n-type or p-type semiconductor layer. The first and second semiconductor layers 1a and 1b may be the same, substantially the same or different from each other. In one example, each of the first and second semiconductor layers 1a and 1b may be an oxide layer including an oxide of the same group as or a different group from the bipolar memory element M1.

In one example, if the first and second semiconductor layers 1a and 1b are n-type semiconductor layers, the first and second semiconductor layers 1a and 1b may be $TiO_x$ layers, $ZnO_x$ layers, IZO layers, combinations thereof, or the like.

In another example, when the first and second semiconductor layers 1a and 1b are p-type semiconductor layers, the first and second semiconductor layers 1a and 1b may be $NiO_x$ layers, $CuO_x$ layers, combinations thereof, or the like.

Still referring to the example embodiment shown in FIG. 3, in this example the first and second metal layers 2a and 2b are metal layers that form Schottky barriers together with the first and second semiconductor layers 1a and 1b, respectively. Each of the first and second metal layers 2a and 2b may be used as an electrode for applying a voltage to the memory cell of FIG. 3 (e.g., corresponding to the first and second electrodes E1 and E2 shown in FIG. 1.)

When the first and second semiconductor layers 1a and 1b and the bipolar memory element M1 include oxides from the same group, the oxygen concentration of the bipolar memory element M1 may be different from the oxygen concentration of the first and second semiconductor layers 1a and 1b. In one example, the oxygen concentration of the bipolar memory element M1 is lower than the oxygen concentration of the first and second semiconductor layers 1a and 1b. In addition, the doping condition (e.g., doping material and/or doping concentration) of the bipolar memory element M1 may be different from the doping condition (e.g., doping material and/or doping concentration) of the first and second semiconductor layers 1a and 1b.

According to at least one other example embodiment, the first and second semiconductor layers 1a and 1b may include an oxide of a different group from the bipolar memory element M1. When the Schottky diodes SD1 and SD2 illustrated in FIG. 3 are used, the circuit diagram of the memory cell including the Schottky diodes SD1 and SD2 may be the same as illustrated in FIG. 2A.

In one example, the stacked structure of first metal layer 2a/first semiconductor layer 1a/bipolar memory element M1/second semiconductor layer 1b/second metal layer 2b shown in FIG. 3 may be Pt/$TiO_x$ (30%)/$TiO_x$ (15%)/$TiO_x$ (30%)/Pt. With regard to $TiO_x$ (30%) and $TiO_x$ (15%), the numbers in parentheses represent the percentage of oxygen contained in a deposition gas used when a film ($TiO_x$) is deposited. The deposition gas may be a mixed gas including oxygen ($O_2$) and argon (Ar), but is not limited thereto. Accordingly, the oxygen concentration of $TiO_x$ (15%) is smaller than the oxygen concentration of $TiO_x$ (30%). In this example, x in $TiO_x$ (15%) may be smaller than x in $TiO_x$ (30%). The numbers in parentheses represent the percentage of oxygen contained in a deposition gas throughout this description.

Figure 4:
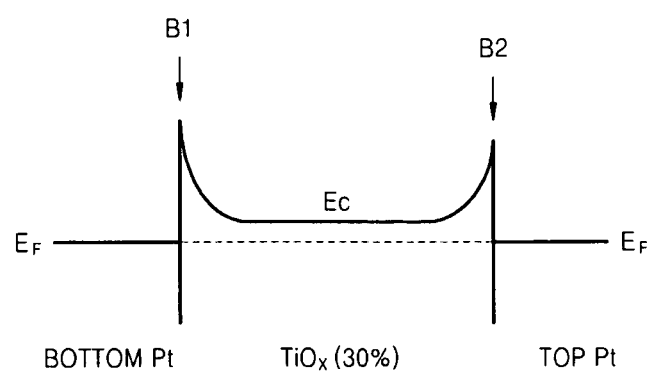
FIG. 4 is an energy band diagram for a switching element that is used in a memory cell according to an example embodiment.

FIG. 4 is an energy band diagram for a memory cell having the structure of FIG. 3 in which the bipolar memory element M1 is not included. That is, FIG. 4 is an energy band diagram of a structure in which the first Schottky diode SD1 and second Schottky diode SD2 of FIG. 3 contact each other. The first and second semiconductor layers 1a and 1b are $TiO_x$ (30%) layers, and the first and second metal layers 2a and 2b are Pt layers. In other words, FIG. 4 is an energy band diagram of the structure of Pt/$TiO_x$ (30%)/Pt. The structure of Pt/$TiO_x$ (30%) corresponds to the first Schottky diode SD1, and the structure of $TiO_x$ (30%)/Pt corresponds to the second Schottky diode SD2. Reference numeral $E_C$ denotes a minimum energy level of a conduction band, and reference numeral $E_F$ denotes a Fermi energy level.

Referring to FIG. 4, a first Schottky barrier B1 is formed between a bottom Pt layer and a $TiO_x$ (30%) layer, and a second Schottky barrier B2 is formed between a top Pt layer and a $TiO_x$ (30%) layer. Thus, the bottom Pt layer and the $TiO_x$ (30%) layer form a first Schottky diode, and the top Pt layer and the $TiO_x$ (30%) layer form a second Schottky diode. The first and second Schottky barriers B1 and B2 may have different heights if an interface characteristic of the bottom Pt layer and the $TiO_x$ (30%) layer is different from an interface characteristic of the top Pt layer and the $TiO_x$ (30%) layer. In at least this example embodiment, the height of the second Schottky barrier B2 is smaller (e.g., slightly smaller) than that of the first Schottky barrier B1. However, according to at least one other example embodiment, the heights of the first and second Schottky barriers B1 and B2 may be the same or substantially the same.

The heights of the first and second Schottky barriers B1 and B2 may be controlled by changing an electrode material or a semiconductor material forming a Schottky barrier together with the electrode material in the structure corresponding to FIG. 4; that is, the structure of Pt/$TiO_x$ (30%)/Pt. For example, if an IZO layer is used instead of the $TiO_x$ (30%) layer, the heights of the first and second Schottky barriers B1 and B2 may be changed. Because the conduction band offset occurring between $TiO_x$ and Pt is about 1.54 eV and the conduction band offset occurring between IZO and Pt is about 0.24 eV, the Schottky barrier between IZO and Pt is lower than the Schottky barrier of $TiO_x$ and Pt. As described above, characteristics of a Schottky diode may be controlled by changing materials for forming a semiconductor layer and a metal layer, which form a Schottky diode.

Figure 5:
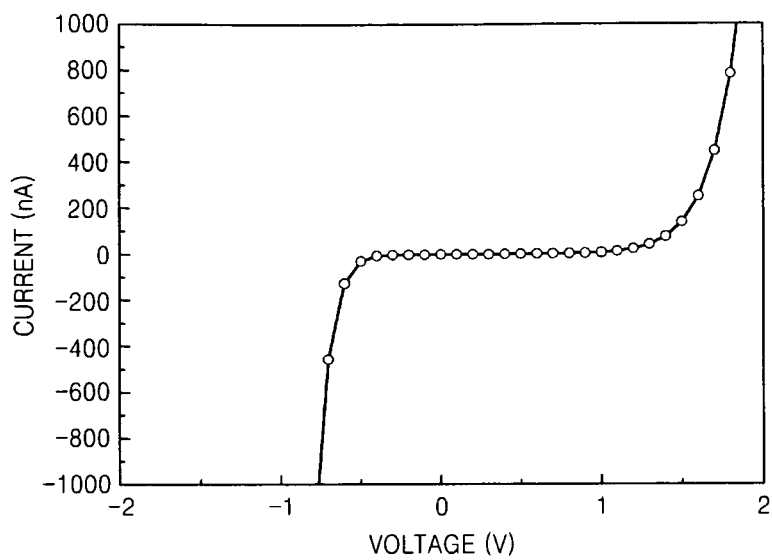
FIG. 5 is a graph showing voltage-current characteristics of a switching element corresponding to the energy band diagram shown in FIG. 4.

FIG. 5 is a graph showing voltage-current characteristics of the above-described Pt/TiO$_x$ (30%)/Pt structure. In FIG. 5, the x axis represents a voltage (V) applied to the top Pt layer. In this regard, about 0 V is applied to the bottom Pt layer.

Referring to FIG. 5, when the voltage applied to the top Pt layer is increased in a positive (+) direction from about 0 V, the switching element turns on when the voltage is about +1.5 V. That is, the first Schottky diode (e.g., a diode including the bottom Pt layer and the TiO$_x$ (30%) layer) turns on. In addition, when the voltage applied to the top Pt layer is increased in a negative (−) direction from about 0 V, a switching element turns on when the voltage is about −0.5 V. That is, the second Schottky diode (e.g., a diode including the TiO$_x$ (30%) layer and the top Pt layer) turns on. When a positive (+) voltage is applied to the top Pt layer, a Schottky barrier between the bottom Pt layer and the TiO$_x$ (30%) layer (e.g., the first Schottky barrier B1 of FIG. 4) is a relatively effective barrier, and when a negative (−) voltage is applied to the top Pt layer, a Schottky barrier between the top Pt layer and the TiO$_x$ (30%) layer (e.g., the second Schottky barrier B2 of FIG. 4) is a relatively effective barrier. Thus, the results of FIG. 5 show that the structure of Pt/TiO$_x$ (30%)/Pt structure has a two-way switching characteristic.

Figure 6:
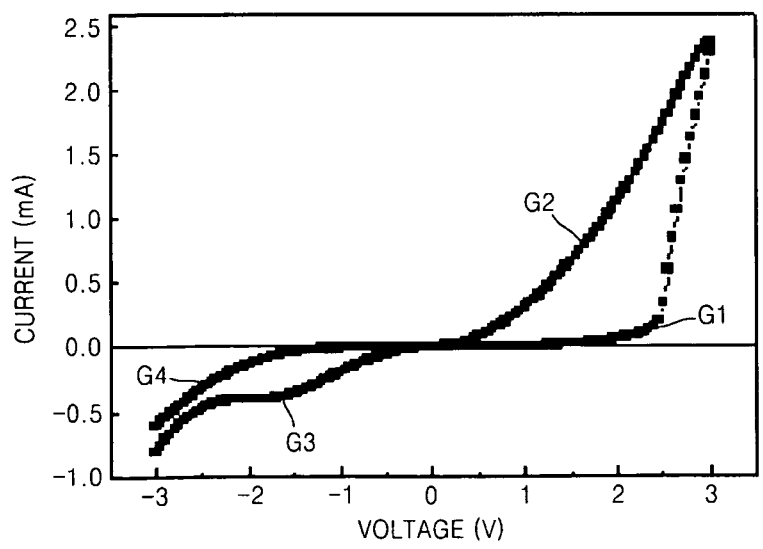
FIG. 6 is a graph showing voltage-current characteristics of a bipolar memory element according to an example embodiment.

FIG. 6 shows voltage-current characteristics of a Pt/TiO$_x$ (15%)/Pt structure. In this regard, the TiO$_x$ (15%) layer is a bipolar memory element.

Referring to FIG. 6, the bipolar memory element, which is a TiO$_x$ (15%) layer, has a bipolar characteristic. First and second graphs G1 and G2 located in a positive (+) voltage range show characteristics of a bipolar memory element in OFF and ON states, respectively. Third and fourth graphs G3 and G4 located in a negative (−) voltage range show characteristics of a bipolar memory element in ON and OFF states, respectively.

Before programming, when a voltage is increased in the positive (+) direction from about 0 V, the voltage-current characteristic follows the first graph G1 and when a voltage greater than or equal to a given set voltage is applied, the voltage-current characteristic follows the second graph G2. In this state, the voltage-current characteristic follows the third graph G3 when the voltage is increased in the negative (−) direction, and the voltage-current characteristic follows the fourth graph G4 when a voltage greater than or equal to a given reset voltage is applied. Moreover, in this state, the voltage-current characteristic follows the first graph G1 when the voltage is increased in the positive (+) direction.

As described above, setting and resetting of the bipolar memory element is performed using positive (+) voltages and negative (−) voltages. The concept of the setting and resetting may be altered.

Figure 7:
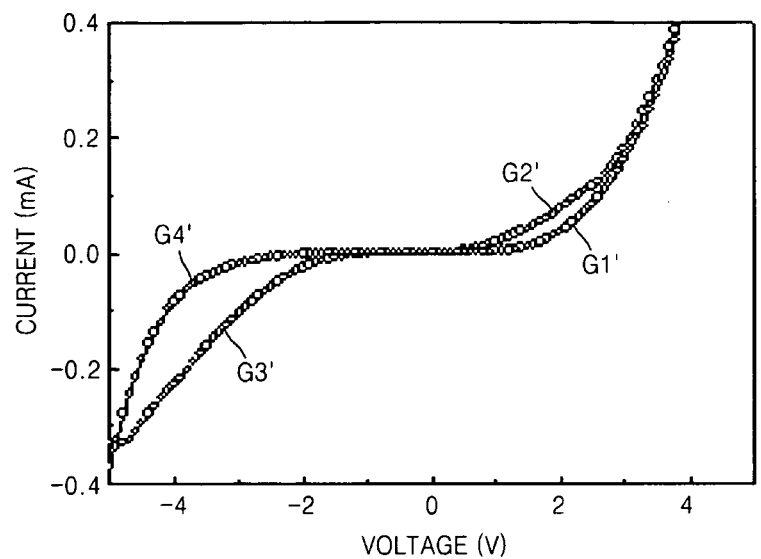
FIG. 7 is a graph showing voltage-current characteristics of a memory cell according to an example embodiment.

FIG. 7 shows voltage-current characteristics of the Pt/TiO$_x$ (30%)/TiO$_x$ (15%)/TiO$_x$ (30%)/Pt structure described above. As shown by the first through fourth graphs G1' through G4' in FIG. 7, the structure of Pt/TiO$_x$ (30%)/TiO$_x$ (15%)/TiO$_x$ (30%)/Pt shows switching (or rectification) characteristics in two-ways based on about 0 V and memory characteristics. Such results are similar to the combination of the results of FIGS. 5 and 6. In FIG. 7, setting and resetting is performed using the positive (+) voltage and the negative (−) voltage, and such a hysteresis curve shows a bipolar characteristic.

As described above, a memory cell having a bipolar memory function and a two-way switching function may be formed by forming the first and second semiconductor layers 1a and 1b and the bipolar memory element M1 using oxides of the same group, wherein the oxygen concentration of the first and second semiconductor layers 1a and 1b is different from the oxygen concentration of the bipolar memory element M1. In this regard, the stack structure of the first semiconductor layer 1a, the bipolar memory element M1, and the second semiconductor layer 1b may form an oxide unit in which the oxygen concentration changes in a height direction. The first semiconductor layer 1a, the bipolar memory element M1, and the second semiconductor layer 1b may be deposited in-situ, and may be patterned at least once using a single mask.

Conventionally, an intermediate electrode is disposed between a memory layer and a switching element to electrically connect the memory layer to the switching element. According to at least this example embodiment, however, the intermediate electrode is omitted, and the bipolar memory element M1 directly contacts the switching elements S1 and S2. Memory and switching functions are still obtained even though the bipolar memory element M1 directly contacts the switching elements S1 and S2. In order to embody memory and switching functions through direct contact, at least portions of the bipolar memory element M1 and switching elements S1 and S2 are formed of oxides with different oxygen concentrations. In this regard, even when the bipolar memory element M1 directly contacts the switching elements S1 and S2, normal memory and switching characteristics may be obtained. As described above, various desirable effects may be obtained even when an intermediate electrode is not used.

When the intermediate electrode is used as in conventional memory devices, it is relatively difficult to balance the characteristics of a memory element and a switching element because the characteristics of the memory element and the switching element are independent. Such difficulty may become relatively serious as devices becomes more integrated. For example, in more highly integrated devices, a forward current density of the switching element is increased by increasing a size (width) of the switching element to obtain a normal resistance change characteristic of a memory layer, thereby enabling programming of the memory layer. However, when the size (width) of the switching element is increased, scaling down a device and the manufacturing process becomes relatively difficult.

However, according to at least some example embodiments, the switching element may have fewer or no requirements, to be satisfied because memory and switching functions are obtained by directly contacting the memory element and the switching element. Accordingly, scaling down of the switching element may be easier, and a memory device may be more highly integrated. In addition, the height of the memory cell may be reduced and the manufacturing process may be simplified because the intermediate electrode need not be formed.

Figure 8:
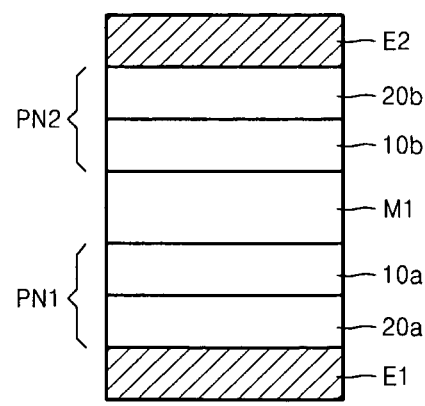
FIGS. 8 and 9 are cross-sectional views of an example embodiment of the memory cell of FIG. 1 in which the switching elements are pn diodes.

FIG. 8 illustrates an example embodiment in which the first and second switching elements S1 and S2 of FIG. 1 are pn diodes.

Referring to FIG. 8, a first pn diode PN1 is disposed on the bottom surface of the bipolar memory element M1, and a second pn diode PN2 is disposed on the top surface of the bipolar memory element M1. The first pn diode PN1 includes a first semiconductor layer 10a and a second semiconductor layer 20a, which are sequentially disposed on the bottom surface of the bipolar memory element M1. The second pn diode PN2 includes a third semiconductor layer 10b and the fourth semiconductor layer 20b, which are sequentially disposed on the top surface of the bipolar memory element M1.

The first and third semiconductor layers 10a and 10b, which contact the bipolar memory element M1, may be the same type of (first conduction type) semiconductor layers. The second and fourth semiconductor layers 20a and 20b, which are separated from the bipolar memory element M1, may be a different type (second conduction-type) from that of the first and third semiconductor layers 10a and 10b. The first and third semiconductor layers 10a and 10b may be n-type semiconductor layers, whereas the second and fourth semiconductor layers 20a and 20b may be p-type semiconductor layers, or vice versa.

The semiconductor layers 10a, 10b, 20a, and 20b may be oxide layers. In this case, the semiconductor layers 10a, 10b, 20a, and 20b may include an oxide of the same group as or a different group from the bipolar memory element M1. For example, among the oxide layers, a p-type oxide layer may be a $CuO_x$ layer or a $NiO_x$ layer, and the n-type oxide layer may be an IZO layer, a $TiO_x$ layer, or a $ZnO_x$ layer. In a p-type oxide layer such as a $CuO_x$ layer, metal vacancies may be formed naturally, and thus, holes may act as carriers. In an n-type oxide layer such as an IZO layer, oxygen vacancies may be formed naturally, and thus, electrons may act as carriers. Amorphous oxide layers, which are more easily formed at room temperature, may be used to form the first and second pn diodes PN1 and PN2. In addition, the first and second pn diodes PN1 and PN2 may be formed using crystalline oxide layers. In the case of a silicon diode, the manufacturing process may be performed at a temperature as high as about 800° C. As a result, only a selected substrate may be used and various problems may occur due to the relatively high temperature. Thus, there are various advantages when the first and second pn diodes PN1 and PN2 are manufactured using oxide layers, which are formed more easily at room temperature. However, the material for forming the first and second pn diode PN1 and PN2 is not limited to oxides. Rather, the first and second pn diodes PN1 and PN2 may also include non-oxides.

The bipolar memory element M1 may include an oxide of the same group as the first and third semiconductor layers 10a and 10b, which contact the bipolar memory element M1. In this case, the oxygen concentration of at least a portion of the bipolar memory element M1 may be different from the oxygen concentration of at least a portion of the first and third semiconductor layers 10a and 10b. In addition; the doping condition (e.g., doping material and/or doping concentration) of at least a portion of the bipolar memory element M1 may be different from the doping condition (e.g., doping material and/or doping concentration) of at least a portion of the first and third semiconductor layers 10a and 10b. According to at least one other example embodiment, an oxide of the bipolar memory element M1 and oxides of the first and third semiconductor layers 10a and 10b may be of a different group from each other.

Referring back to FIG. 8, a first electrode E1 is disposed on a bottom surface of the second semiconductor layer 20a, and a second electrode E2 is disposed on a top surface of the fourth semiconductor layer 20b. The first electrode E1 may be formed of a metal that makes ohmic contact with the second semiconductor layer 20a. The second electrode E2 may be formed of a metal that makes ohmic contact with the fourth semiconductor layer 20b.

When using the first and second pn diodes PN1 and PN2 illustrated in FIG. 8, the circuit diagram of the memory cell may be the same as illustrated in FIG. 2A or FIG. 2B.

On the one hand, in FIG. 8, when the first and third semiconductor layers 10a and 10b are n-type semiconductor layers and the second and fourth semiconductor layers 20a and 20b are p-type semiconductor layers, the circuit diagram of the memory cell may be the same as illustrated in FIG. 2A.

On the other hand, in FIG. 8, when the first and third semiconductor layers 10a and 10b are p-type semiconductor layers and the second and fourth semiconductor layers 20a and 20b are n-type semiconductor layers, the circuit diagram of the memory cell may be the same as illustrated in FIG. 2B.

Figure 9:
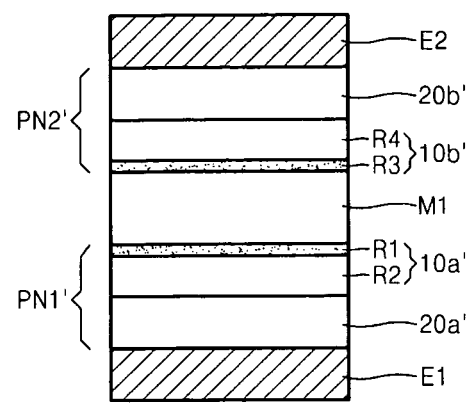

FIG. 9 is a cross-sectional view of a memory cell according to another example embodiment in which the first and second switching elements S1 and S2 are pn diodes. In FIG. 9, the reference numerals 10a', 20a', 10b', and 20b' denote first through fourth semiconductor layers, respectively, and PN1' and PN2' denote first and second pn diodes. The first and third semiconductor layers 10a' and 10b' are first conduction-type semiconductors, whereas the second and fourth semiconductor layers 20a' and 20b' are second conduction-type semiconductors.

Referring to FIG. 9, the first semiconductor layer 10a' may include a region having relatively high electric conductivity (or conductive region, which is referred to hereinafter as a first region R1) at an interface between the first semiconductor layer 10a' and the bipolar memory element M1. A residue region of the first semiconductor layer 10a' (referred to hereinafter as a second region R2), other than the first region R1, has a semiconductor characteristic.

Like the first semiconductor layer 10a', the third semiconductor layer 10b' may have a region having relatively high electric conductivity (or conductive region, which is hereinafter referred to as a third region R3) at an interface between the third semiconductor layer 10b' and the bipolar memory element M1. A residue region of the third semiconductor layer 10b' (referred to hereinafter as the fourth region R4), other than the third region R3, may have a semiconductor characteristic. As described above, the first and third semiconductor layers 10a' and 10b' may include the first and third regions R1 and R3 having relatively high electric conductivity, respectively, and may directly contact the bipolar memory element M1 through the first and third regions R1 and R3. Accordingly, an intermediate electrode (e.g., formed of metal, etc.) need not be formed between the first and third semiconductor layers 10a' and 10b' and the bipolar memory element M1.

When the first and third semiconductor layers 10a' and 10b' are n-type oxide layers, the first and third regions R1 and R3 having relatively high electric conductivity may have a lower oxygen concentration in the first and third semiconductor layers 10a' and 10b', respectively. In this example, the oxygen concentration of the first and third regions R1 and R3 may be lower than the oxygen concentration of the second and fourth regions R2 and R4. This is because in the case of an n-type oxide, generally, lower oxygen concentration leads to higher carrier concentration, and relatively high electric conductivity. When the first and third semiconductor layers 10a' and 10b' are p-type oxide layers, the first and third regions R1 and R3 may have a relatively high oxygen concentration in the first and third semiconductor layers 10a' and 10b'. In this example, the oxygen concentration of the first and third regions R1 and R3 may be higher than the oxygen concentration of the second and fourth regions R2 and R4. This is because in the case of a p-type oxide, generally, higher oxygen concentration leads to higher carrier concentration, and relatively high electric conductivity. Meanwhile, when the first and third semiconductor layers 10a' and 10b' are non-oxide layers (e.g., silicon-based semiconductor layers), the first and third regions R1 and R3 may be regions doped with a relatively high concentration of a conductive impurity (n-type or p-type).

Even in the example embodiments illustrated in FIGS. 8 and 9, the bipolar memory element M1 and the switching element (e.g., pn diodes PN1, PN1', PN2, and PN2') may include oxides, and the bipolar memory element M1 may directly contact the switching element.

According to at least one other example embodiment, in FIG. 8 at least one of the semiconductor layers 10a, 10b, 20a, and 20b may have a bipolar memory characteristic. In this case, at least a portion of the switching element (e.g., the first and second pn diodes PN1 and PN2) may have a bipolar memory characteristic, and an additional memory element need not be used. An example of this structure is illustrated in FIG. 10.

Figure 10:
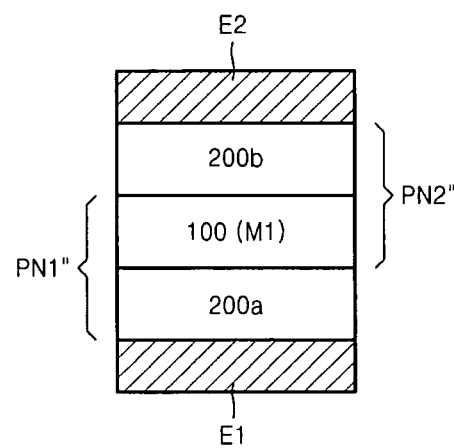
FIG. 10 is a cross-sectional view of a memory cell according to another example embodiment.

Referring to FIG. 10, a first semiconductor layer 100 having a bipolar memory characteristic is provided, and second and third semiconductor layers 200a and 200b are disposed on bottom and top surfaces of the first semiconductor layer 100. In this example, the semiconductor layer 100 is a first conduction type semiconductor layer, whereas the second and third semiconductor layers 200a and 200b are second conduction type semiconductor layers. If the first semiconductor layer 100 is a p-type semiconductor layer, the second and third semiconductor layers 200a and 200b are n-type semiconductor layers. If the first semiconductor layer 100 is an n-type semiconductor layer, the second and third semiconductor layers 200a and 200b are p-type semiconductor layers.

When the first semiconductor layer 100 is a p-type semiconductor layer, the first semiconductor layer 100 may include, for example, Ni oxide, Cu oxide, a combination thereof or the like. When the first semiconductor layer 100 is an n-type semiconductor layer, the first semiconductor layer 100 may include, for example, at least one oxide selected from the group consisting of or including: Ti oxide, Co oxide, Hf oxide, Zr oxide, Zn oxide, W oxide, Nb oxide, TiNi oxide, LiNi oxide, Al oxide, InZn oxide, V oxide, SrZr oxide, SrTi oxide, Cr oxide, Fe oxide, Ta oxide, PrCaMnO (PCMO), a combination thereof or the like. These materials may have a bipolar memory characteristic, and may form a diode by connection with a different-type semiconductor layer (e.g., the second and third semiconductor layers 200a and 200b). The first semiconductor layer 100 that is a bipolar memory element may form a first switching element (e.g., a first pn diode PN1") together with the second semiconductor layer 200a, and may form a second switching element (e.g., a second pn diode PN2") together with the third semiconductor layer 200b. Accordingly, the structure of FIG. 10 may also be regarded as a structure in which first and second pn diodes PN1" and PN2" are disposed at opposite sides of the bipolar memory element M1 (e.g., the first semiconductor layer 100). The switching direction of the first pn diode PN1" may be opposite to the switching direction of the second pn diode PN2." The second and third semiconductor layers 200a and 200b may have a composition (or a physical property) that is controlled not to have a bipolar memory characteristic therein. However, according to at least one other example embodiment, at least a portion of the second and third semiconductor layers 200a and 200b may also have a bipolar memory characteristic.

As in the example embodiment illustrated in FIG. 10, when a portion of the switching elements PN1" and PN2" is used as a bipolar memory element (e.g., when the bipolar memory element is included in the switching elements PN1" and PN2") the structure of a memory device is more simplified, and thus, relatively high integration rates may be more easily achieved.

Figure 11:
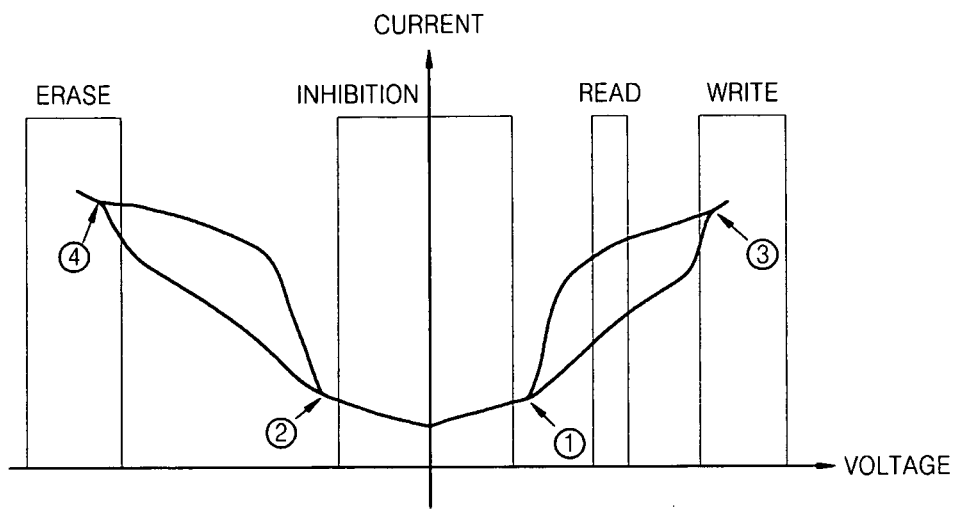
FIGS. 11 and 12 are graphs showing voltage-current characteristics of memory cells according to example embodiments.
Figure 12:
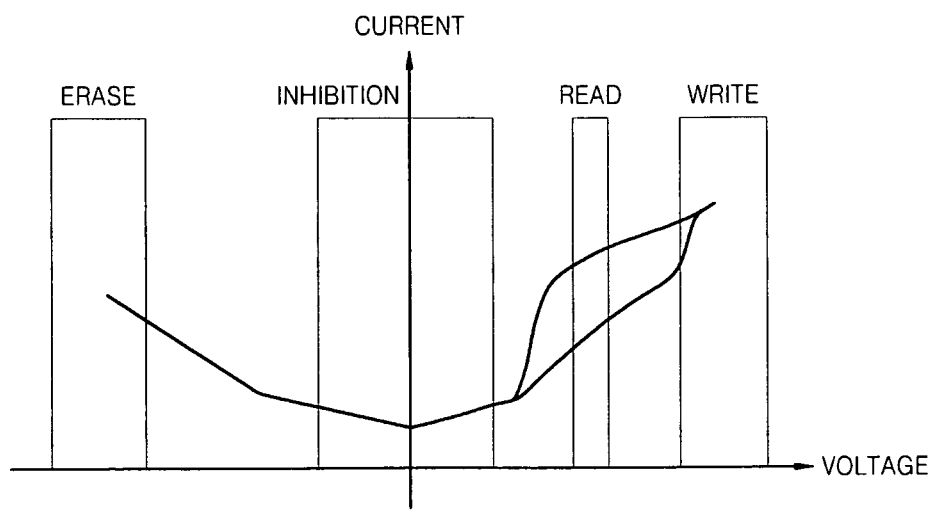

Memory cells according to example embodiments show voltage-current characteristics as illustrated in FIG. 11 or FIG. 12. FIGS. 11 and 12 are voltage-current graphs represented in a log scale.

Referring to FIG. 11, point (1) and point (2) respectively correspond to first and second threshold voltages, whereas point (3) and point (4) respectively correspond to set and reset voltages. Accordingly, a write voltage is in the vicinity of point (3), and an erase voltage is in the vicinity of point (4). The concepts of the set voltage and reset voltage may be altered, and the concepts of write and erase of information may also be altered. A read voltage is between point (1) and point (3). An inhibition region is set between point (1) and point (2). The inhibition region refers to a voltage range in which other memory cells maintain their original states when a given memory cell operates. The inhibition region may be regarded as a window for memory operation.

Referring to FIG. 12, a write voltage, a read voltage, an erase voltage, and an inhibition region are similar to those described with reference to FIG. 11.

Figure 13:
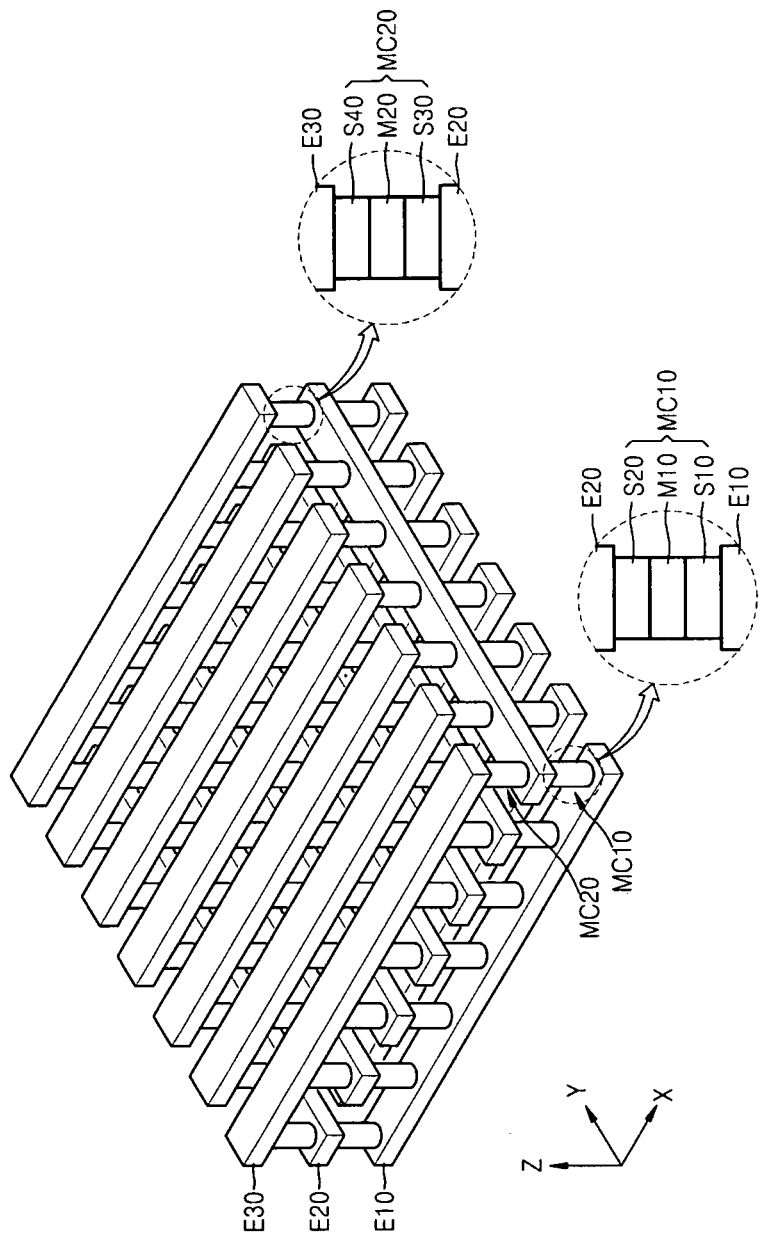
FIG. 13 is a perspective view of a memory device according to an example embodiment.

FIG. 13 is a perspective view of a memory device including a plurality of memory cells according to an example embodiment. The memory device according to at least this example embodiment is a multi-layer cross-point resistive memory device.

Referring to FIG. 13, a plurality of first electrodes E10 are disposed in parallel with each other. Each first electrode E10 has a wire shape and extends in a first direction (e.g., an X axis direction). A plurality of second electrodes E20 are also disposed in parallel with each other. Each second electrode E20 also has a wire shape. The second electrodes E20 are separated from the first electrodes E10, but cross each other. In the example embodiment shown in FIG. 13, the second electrodes E20 are arranged perpendicular to the first electrodes E10. In this case, the second electrodes E20 extend in a second direction (e.g., a Y axis direction), which is perpendicular to the first direction. The extension directions of the first and second electrodes E10 and E20 may be altered, and the shapes of the first and second electrodes E10 and E20 may be changed.

The first and second electrodes E10 and E20 may be formed of an electrode material that is generally used in semiconductor devices, and may have a single-layered or multi-layered structure. For example, the first and second electrodes E10 and E20 may include at least one selected from the group consisting of or including: Pt, Au, Pd, Ir, Ag, Ni, Al, Mo, Cu, combinations thereof or the like. The first and second electrodes E10 and E20 may be formed of the same, substantially the same or different materials and may have the same, substantially the same or different structures.

In the example embodiment shown in FIG. 13, a first memory cell MC10 is disposed at each intersection of the first electrodes E10 and the second electrodes E20. The first memory cell MC10 may have the same or substantially the same structure as that of the memory cell MC1 of FIG. 1. In more detail, the first memory cell MC10 may include a first switching element S10, a first bipolar memory element M10 and a second switching element S20, which are sequentially disposed in that order on the first electrode E10. In this example, the first switching element S10, the first bipolar memory element M10 and the second switching element S20 correspond to the first semiconductor layer 1a, the bipolar memory element M1, and the second semiconductor layer 1b of FIG. 3, respectively. In this regard, the first and second electrodes E10 and E20 correspond to the first and second metal layers 2a and 2b of FIG. 3, respectively. A first Schottky barrier may be formed between the first switching element S10 and the first electrode E10, and a second Schottky barrier may be formed between the second switching element S20 and the second electrode E20.

Alternatively, the first switching element S10, the first bipolar memory element M10 and the second switching element S20 may respectively correspond to the first pn diode PN1, the bipolar memory element M1, and the second pn diode PN2 of FIG. 8. In yet another alternative, the first switching element S10, the first bipolar memory element M10 and the second switching element S20 may respectively correspond to the first pn diode PN1', the bipolar memory element M1, and the second pn diode PN2' of FIG. 9.

In yet another example, the first bipolar memory element M10, the first switching element S10, and the second switching element S20 may respectively correspond to the first semiconductor layer 100, the second semiconductor layer 200a, and the third semiconductor layer 200b of FIG. 10.

The materials, structures, and characteristics of the first switching element S10, the first bipolar memory element M10, and the second switching element S20 have been described with reference to FIGS. 1 through 3 and 8 through 10. For example, if the first memory cell MC10 has a structure similar to that of the memory cell of FIG. 3, the first memory cell MC10 may include oxides of the same group and the oxygen concentration thereof may vary according to a height direction (e.g., a Z-axis direction). In a more concrete example, the first electrode E10, the first switching element S10, the first bipolar memory element M10, the second switching element S20, and the second electrode E20 may be a Pt layer, a $TiO_x$ (30%) layer, a $TiO_x$ (15%) layer, a $TiO_x$ (30%) layer and a Pt layer, respectively. However, the structure of the first memory cell MC10 is not limited thereto and may vary as described above.

Still referring to FIG. 13, a plurality of third electrodes E30 are disposed on top surfaces of the second electrodes E20 and are separated from the second electrodes E20. Each third electrode E30 has a wire shape, and the third electrodes E30 are disposed in parallel with each other. The third electrodes E30 and the second electrodes E20 also cross each other. In this example, the third electrodes E30 and the second electrodes E20 are arranged perpendicular to each other. A material for forming the third electrodes E30 may be the same or substantially the same as the material of the first and second electrodes E10 and E20.

A second memory cell MC20 is disposed at each intersection of the second electrodes E20 and the third electrodes E30. The second memory cell MC20 includes a third switching element S30, a second bipolar memory element M20 and a fourth switching element S40, which are sequentially disposed on the second electrode E20 in that order. The third switching element S30, the second bipolar memory element M20 and the fourth switching element S40 correspond to the first switching element S10, the first bipolar memory element M10 and the second switching element S20, respectively. In this example, the second memory cell MC20 and the first memory cell MC10 have the same stacked structure. In this regard, the first and second memory cells MC10 and MC20 may have the circuit structure of FIG. 2A or FIG. 2B. The switching direction of the third switching element S30 may be opposite to the switching direction of the first switching element S10, and the switching direction of the fourth switching element S40 may be opposite to the switching direction of the second switching element S20. Thus, the third and fourth switching elements S30 and S40 of the second memory cell MC20 may have switching directions opposite to those of the first and second switching elements S10 and S20 of the first memory cell MC10. In this regard, any one of the first and second memory cells MC10 and MC20 may have the circuit structure of FIG. 2A, and the other memory cell may have the circuit structure of FIG. 2B.

Figure 14A:
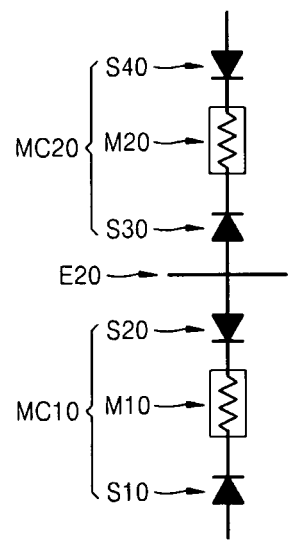
FIGS. 14A and 14B are circuit diagrams of memory devices according to example embodiments.
Figure 14B:
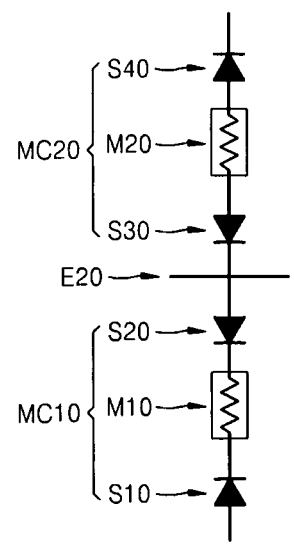

FIGS. 14A and 14B illustrate example circuit structures, each including the first memory cell MC10, the second electrode E20 and the second memory cell MC20 of FIG. 13.

Referring to FIG. 14A, each of the first memory cell MC10 and the second memory cell MC20 has the circuit structure of FIG. 2A.

The second and third switching elements S20 and S30 located at opposite sides of the second electrode E20 have opposite switching directions. As a result, information may be simultaneously written to two bipolar memory elements M10 and M20 using the second electrode E20 as a common bit line.

Referring to FIG. 14B, the first memory cell MC10 has the circuit structure of FIG. 2A, but the second memory cell MC20 has the circuit structure of FIG. 2B. In this example, the second and third switching elements S20 and S30 located at opposite sides of the second electrode E20 have the same switching directions, and thus, information may be written to any one of the bipolar memory elements M10 and M20 by one programming operation.

In FIG. 13, the first and second memory cells MC10 and MC20 are cylindrical. However, the shapes of the first and second memory cells MC10 and MC20 are not limited thereto. For example, the first and second memory cells MC10 and MC20 may have a square pillar shape or a shape that has an increasing (or tapered) width (e.g., in the downward direction). For example, the first and second memory cells MC10 and MC20 extend outward from the intersections of the first and second electrodes E10 and E20 and the intersections of the second and third electrodes E20 and E30.

Although not illustrated, the memory device of FIG. 13 may further include a structure that is the same or substantially the same as the stack structure including the first memory cell MC10 and the second electrode E20, on the third electrode E30.

Alternatively, the memory device of FIG. 13 may further include at least one set of a structure that is the same or substantially the same as the stack structure including the first memory cell MC10, the second electrode E20, the second memory cell MC20 and the third electrode E30, on the third electrode E30.

Alternatively, the memory device of FIG. 13 may further include at least one set of a structure that is the same or substantially the same as the stack structure including the first memory cell MC10, the second electrode E20, the second memory cell MC20, the third electrode E30, the first memory cell MC10, and the second electrode E20, which are sequentially stacked in that order, on the third electrode E30.

Figure 15:
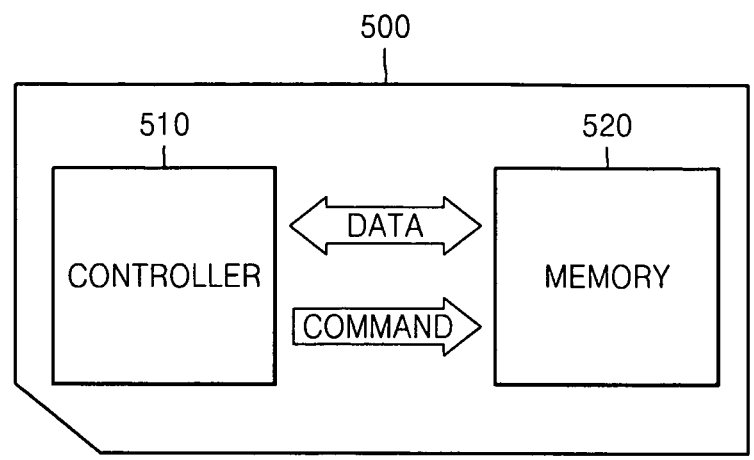
FIG. 15 is a schematic diagram illustrating a memory card according to an example embodiment.

FIG. 15 is a schematic diagram illustrating a memory card according to an example embodiment.

Referring to FIG. 15, a controller 510 and a memory 520 are configured to exchange electrical signals. For example, the memory 520 and the controller 510 are configured to exchange data according to commands of the controller 510. The memory card 500 may either store data in the memory 520 or output data from the memory 520. The memory 520 may include one of the non-volatile memory devices described above with reference to FIGS. 1 through 14B.

Such a memory card 500 may be used as a storage medium for various portable electronic devices. For example, the memory card 500 may be a multimedia card (MMC), a secure digital (SD) card or the like.

Figure 16:
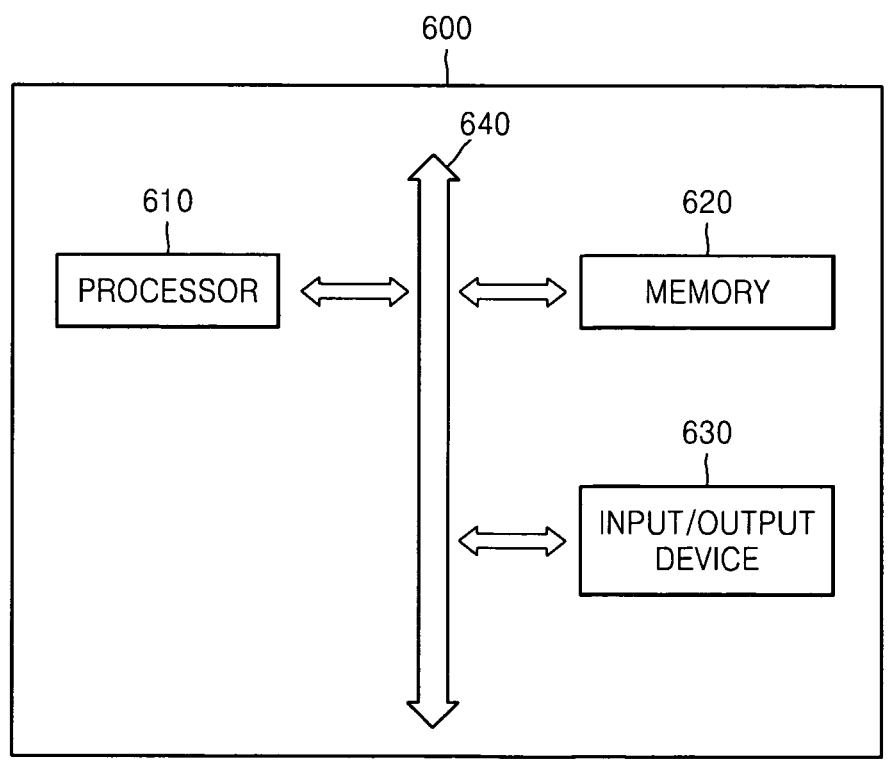
FIG. 16 is a block diagram illustrating an electronic system according to an example embodiment.

FIG. 16 is a block diagram illustrating an electronic system according to an example embodiment.

Referring to FIG. 16, a processor 610, an input/output device 630, and a memory 620 perform data communication with each other via a bus 640. The processor 610 is configured to execute a program and control the electronic system 600. The input/output device 630 is configured to input/output data to/from the electronic system 600. The electronic system 600 may be connected to an external device such as a personal computer or a network, by the input/output device 630. The electronic system is configured to exchange data with the external device.

The memory 620 is configured to store codes or programs for operating the processor 610. The memory 620 may include one of the non-volatile memory devices described above with reference to FIGS. 1 through 14B.

The electronic system 600 may embody various electronic control systems requiring or including the memory 620, and may be used in mobile phones, MP3 players, navigation devices, solid state disks (SSD), household appliances, etc.

Example embodiments are discussed herein with regard to bipolar memory elements. However, example embodiments may also be applicable to unipolar memory elements. A unipolar memory element differs from a bipolar memory element in that the unipolar memory element includes a data storage element that exhibits unipolar switching in which resistance characteristics or a resistance state of the data storage material layer are switchable between two different states (a high resistance state and a low resistance state) using voltages having the same polarity. In this context, "resistance characteristics" refers to a device's response to a particular applied voltage. Thus, in having "different resistance characteristics," the device's response to the same or substantially the same voltage is different depending on the resistance state of the device. The data storage material layer may be a transition metal oxide layer such as NiO, $V_2O_5$, ZnO, $Nb_2O_5$, $TiO_2$, $WO_3$, CoO layers, etc.

The example embodiments described herein should be considered in a descriptive sense only and not for purposes of limitation. Descriptions of features or aspects within each example embodiment should be considered as available for other similar features or aspects in other example embodiments. For example, it would be obvious to one of ordinary of ordinary skill in the art that the structures of a, memory device presented in the example embodiments described above may be variously changed. In more detail, the memory cells illustrated in FIGS. 1, 3, and 8 through 10 may be used in various other memory devices, in addition to the cross-point memory device illustrated in FIG. 13. Moreover, in the memory cells according to example embodiments described above, various other memory elements, in addition to a resistive memory element, may also be used as a bipolar memory element.

What is claimed is:

1. A memory device comprising a memory cell, the memory cell comprising:
   a bipolar memory element; and
   a bidirectional switching element having a bidirectional switching characteristic, the bidirectional switching element including at least two switching elements having opposite switching directions, the at least two switching elements being connected to ends of the bipolar memory element.

2. A memory device including a memory cell, the memory cell comprising:
   a bipolar memory element;
   a first switching element connected to a first end of the bipolar memory element and having a first switching direction; and
   a second switching element connected to a second end of the bipolar memory element and having a second switching direction, which is opposite to the first switching direction.

3. The memory device of claim 2, wherein the first and second switching elements are Schottky diodes.

4. The memory device of claim 3, wherein the first switching element includes a first semiconductor layer and the second switching element includes a second semiconductor layer, and each of the first and second semiconductor layers contact the bipolar memory element, and wherein the bipolar memory element, the first semiconductor layer and the second semiconductor layers are oxide layers.

5. The memory device of claim 4, wherein an oxygen concentration of the bipolar memory element is lower than oxygen concentrations of the first and second semiconductor layers.

6. The memory device of claim 3, wherein the first switching element includes a first electrode contacting a first semiconductor layer, and the second switching element includes a second electrode contacting a second semiconductor layer; wherein
   the first electrode, the first semiconductor layer, the bipolar memory element, the second semiconductor layer and the second electrode are in the form of a stack structure.

7. The memory device of claim 6, wherein the first electrode and the second electrode are platinum (Pt) layers, the first and second semiconductor layers are $TiO_x$ (30%) layers, and the bipolar memory element is a $TiO_x$ (15%) layer.

8. The memory device of claim 2, wherein the first and second switching elements are pn diodes.

9. The memory device of claim 8, wherein the first switching element includes a first semiconductor layer, and the second switching element includes a second semiconductor layer, and wherein the first and second semiconductor layers contact the bipolar memory element, and a conductive region is formed in a portion of each of the first and second semiconductor layers contacting the bipolar memory element.

10. The memory device of claim 9, wherein the first and second semiconductor layers are n-type oxide layers, and the conductive region has a lower oxygen concentration than residue regions of the first and second semiconductor layers.

11. The memory device of claim 9, wherein the first and second semiconductor layers are p-type oxide layers, and the conductive region has a higher oxygen concentration than residue regions of the first and second semiconductor layers.

12. The memory device of claim 8, wherein the bipolar memory element is formed of an oxide.

13. The memory device of claim 2, wherein at least a part of the bipolar memory element forms a part of the first and second switching elements.

14. The memory device of claim 13, wherein the memory cell further comprises:
   a first semiconductor layer having a first conduction type; and
   second and third semiconductor layers having a second conduction type disposed at ends of the first semiconductor layer; wherein
   the first semiconductor layer is the bipolar memory element,
   the first semiconductor layer and the second semiconductor layer form the first switching element, and
   the first semiconductor layer and the third semiconductor layer form the second switching element.

15. The memory device of claim 2, wherein the bipolar memory element includes an oxide resistor.

16. The memory device of claim 15, wherein the oxide resistor includes at least one material selected from the group including Ti oxide, Ni oxide, Cu oxide, Co oxide, Hf oxide, Zr oxide, Zn oxide, W oxide, Nb oxide, TiNi oxide, LiNi oxide, Al oxide, InZn oxide, V oxide, SrZr oxide, Seri oxide, Cr oxide, Fe oxide, Ta oxide, and PCMO (PrCaMnO).

17. The memory device of claim 15, wherein each of the first and second switching elements includes an oxide semiconductor.

18. The memory device of claim 17, wherein the oxide semiconductor includes an oxide of the same group as the oxide resistor.

19. The memory device of claim 17, wherein the oxide semiconductor includes an oxide of a different group from the oxide resistor.

20. The memory device of claim 17, wherein the oxygen concentration of at least a portion of the bipolar memory element is different from the oxygen concentration of at least a portion of the first and second switching elements.

21. The memory device of claim 2, wherein each of the first and second switching elements includes an oxide semiconductor.

22. The memory device of claim 2, wherein a doping condition of at least a portion of the bipolar memory element is different from a doping condition of at least a portion of the first and second switching elements.

23. The memory device of claim 2, wherein the first and second switching elements directly contact ends of the bipolar memory element.

24. The memory device of claim 2, wherein the memory cell is an oxide unit.

25. The memory device of claim 2, further comprising:
a plurality of first electrodes having a wire shape, the plurality of first electrodes being disposed in parallel with each other; and
a plurality of second electrodes having a wire shape, the plurality of second electrodes being disposed in parallel with each other; wherein
the memory cell is disposed at each of the intersections of the first and second electrodes.

26. The memory device of claim 25, wherein the memory cell is a first memory cell, and the memory device further comprises:
a plurality of third electrodes crossing the second electrodes, the plurality of third electrodes having a wire shape, and being in parallel with each other; and
a second memory cell disposed at each of the intersections of the second and third electrodes.

27. The memory device of claim 26, wherein the second memory cell and the first memory cell have a same structure.

28. The memory device of claim 26, wherein the second memory cell has a modified structure from the first memory cell in which the switching directions of first and second switching elements are inversed.

29. A memory card comprising:
a controller; and
a memory including the memory device of claim 1, the memory being configured to exchange data with the controller according to commands from the controller.

30. An electronic device comprising:
a processor configured to control the electronic device;
an input/output device configured to input/output data to/from the electronic device; and
a memory including the memory device of claim 1, the memory being configured to store at least one of codes and programs for operating the processor; wherein
the processor, the input/output device and the memory are configured to exchange data via a bus.

* * * * *